(12) United States Patent
Roig-Guitart et al.

(10) Patent No.: US 12,549,103 B2
(45) Date of Patent: Feb. 10, 2026

(54) POWER TRANSISTORS WITH RESONANT CLAMPING CIRCUITS

(71) Applicant: SEMICONDUCTOR COMPONENTS INDUSTRIES, LLC, Scottsdale, AZ (US)

(72) Inventors: Jaume Roig-Guitart, Oudenaarde (BE); Dean E. Probst, West Jordan, UT (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 207 days.

(21) Appl. No.: 18/468,400

(22) Filed: Sep. 15, 2023

(65) Prior Publication Data

US 2025/0096679 A1 Mar. 20, 2025

(51) Int. Cl.
*H02M 3/158* (2006.01)
*H03K 17/687* (2006.01)

(52) U.S. Cl.
CPC ........ *H02M 3/158* (2013.01); *H03K 17/6871* (2013.01); *H03K 2217/0063* (2013.01); *H03K 2217/0072* (2013.01)

(58) Field of Classification Search
CPC .............. H02M 3/158; H03K 17/6871; H03K 2217/0063; H03K 2217/0072
See application file for complete search history.

(56) References Cited

U.S. PATENT DOCUMENTS 8,890,496 B2 * 11/2014 Inoue .................... H02M 3/158
323/282
2009/0206812 A1 * 8/2009 Sasaya .................... H03K 17/14
323/282
2012/0280674 A1 11/2012 Hirst
2016/0036431 A1 2/2016 Roig-Guitart et al.
2016/0118380 A1 4/2016 Lui et al.
2017/0194486 A1 7/2017 Venkatraman et al.
2019/0103866 A1 4/2019 Sakai
2022/0407411 A1 12/2022 Probst et al.

FOREIGN PATENT DOCUMENTS

DE 10100890 A1 7/2008

OTHER PUBLICATIONS

Extended European Search Report for counterpart application No. EP24150434.9, mailed Jun. 11, 2024, 8 pages.
Power Mosfet Selecting Mosffets and Consideration for Circuit Design. Toshiba Application Notes, Jul. 26, 2018, 18 pages.
Severns, Rudy, et al., "Design of snubbers for power circuits", 2006, International Rectifier Corporation, 29 pages.

* cited by examiner

*Primary Examiner* — Rafael O De Leon Domenech
(74) *Attorney, Agent, or Firm* — Brake Hughes Bellermann LLP (57) ABSTRACT

In a general aspect, a circuit includes a metal-oxide semiconductor field-effect transistor (MOSFET) having a gate, a source, and a drain. The MOSFET has a first breakdown voltage. The circuit also includes a clamping circuit coupled between the drain and the source. The clamping circuit including a diode having a second breakdown voltage that is less than the first breakdown voltage. A cathode of the diode is coupled with the drain of the MOSFET. The clamping circuit further includes an inductor having a first terminal coupled with an anode of the diode, and a second terminal coupled with the source of the MOSFET.

20 Claims, 9 Drawing Sheets

POWER TRANSISTORS WITH RESONANT CLAMPING CIRCUITS

TECHNICAL FIELD

This description relates to semiconductor devices and, more particularly, to transistor circuits, such as field effect transistors implemented with a resonant clamping circuit, which can be used, e.g., in power converter circuits.

BACKGROUND

Power transistors are used in a number of applications, such as consumer electronics, automotive electronics, industrial electronics, etc. For example, power transistors are used in power conversion circuits, such as direct-current to direct-current (DC-DC) power converters (e.g., synchronous buck converters, etc.), where a power output of the power converter is coupled to a switch node between a high-side (HS) transistor and a low-side (LS) transistor of half-bridge circuit included in a power converter. Voltage and current overshoot and/or ringing can occur, e.g., during switching of the half-bridge circuit. Such overshoot and/or ringing can cause a voltage on a power supply node and/or the switch node to exceed a respective breakdown voltage of the HS or LS transistor, such as a drain-to-source breakdown voltage ($BV_{dss}$) of a vertical, trench-gate, power metal-oxide semiconductor field-effect transistor (MOSFET), e.g., breakdown voltage of a body diode of the MOSFET. When MOSFET $BV_{dss}$ is exceeded, power conversion efficiency of an associated power converter can be reduced and/or damage to the transistor can occur, such as threshold drift, breakdown voltage shift, structural damage, etc.

One approach used to prevent such power efficiency loss and/or potential transistor damage, e.g., for a given implementation, is to increase $BV_{dss}$ of the transistors. However, increasing $BV_{dss}$ also increases on-state resistance of the transistors, such as drain-to-source on-state resistance ($R_{dson}$), which results in higher resistive losses, and also decreases power conversion efficiency.

SUMMARY

In a general aspect, a circuit includes a metal-oxide semiconductor field-effect transistor (MOSFET) having a gate, a source, and a drain. The MOSFET has a first breakdown voltage. The circuit also includes a clamping circuit coupled between the drain and the source. The clamping circuit including a diode having a second breakdown voltage that is less than the first breakdown voltage. A cathode of the diode is coupled with the drain of the MOSFET. The clamping circuit further includes an inductor having a first terminal coupled with an anode of the diode, and a second terminal coupled with the source of the MOSFET.

Implementations can include one or more of the following features or aspects, alone or in combination. For example, the clamping circuit can be configured to resonate when a voltage applied to the drain of the MOSFET exceeds a breakdown voltage of the diode.

The clamping circuit can include a capacitor and a resistor that is coupled in series with the capacitor. The capacitor and the resistor can be coupled in parallel with the diode and the inductor. The resistor and the capacitor can be coupled in parallel with the diode, and coupled in series with the inductor.

The clamping circuit can include a frequency-dependent resistor. The second terminal of the inductor can be coupled with the source of the MOSFET via the frequency-dependent resistor.

The inductor can be a first inductor. The clamping circuit can include a resistive-inductive-capacitive (RLC) circuit having a capacitor, a resistor, and a second inductor. The capacitor, the resistor and the second inductor can be coupled in series with each other. The RLC circuit can be coupled in parallel with the diode and the first inductor.

The MOSFET can be included in a first semiconductor die. The diode can be included in a second semiconductor die that is co-packaged with the first semiconductor die. The inductor can include inductance of an electrical interconnect between the first semiconductor die and the second semiconductor die.

The circuit can be implemented in a semiconductor die. The diode can include a plurality of interconnected stripes. The MOSFET can include a plurality of interconnected stripes. The inductor can includes inductance from at least one of an electrical contact to the anode of the diode, an electrical contact to a source of the MOSFET, an electrical connection between a first stripe and a second stripe of the plurality of interconnected stripes of the diode, an electrical connection between a first stripe and a second stripe of the plurality of interconnected stripes of the MOSFET, or an electrical connection between the anode of the diode and the source of the MOSFET.

The circuit can be implemented in a semiconductor die. The semiconductor die can include a metal layer electrically coupling the source of the MOSFET with the anode of the diode. The metal layer can have an inductance included in the inductor. The metal layer can include a plurality of openings configured to adjust the inductance of the metal layer.

In another general aspect, a half-bridge circuit includes a high-side transistor circuit and a low-side transistor circuit. The high-side transistor circuit includes a first metal-oxide semiconductor field-effect transistor (MOSFET) having a gate, a source, and a drain. The first MOSFET has a first breakdown voltage. The high-side transistor circuit also includes a first clamping circuit including a first diode having a second breakdown voltage that is less than the first breakdown voltage. A cathode of the first diode is coupled with the drain of the first MOSFET. The first clamping circuit further includes a first inductor having a first terminal coupled with an anode of the first diode, and a second terminal coupled with the source of the first MOSFET. The low-side transistor circuit includes a second MOSFET including a gate, a source, and a drain. The second MOSFET has a third breakdown voltage. The drain of the second MOSFET is coupled with the source of the first MOSFET. The low-side transistor circuit also includes a second clamping circuit including a second diode having a fourth breakdown voltage that is less than the third breakdown voltage. A cathode of the second diode is coupled with the drain of the second MOSFET. The second clamping circuit further includes a second inductor having a first terminal coupled with an anode of the first diode, and a second terminal coupled with the source of the second MOSFET.

Implementations can include one or more of the following features or aspects, alone or in combination. For example, the first clamping circuit can be configured to resonate when a voltage applied to the drain of the first MOSFET exceeds a breakdown voltage of the first diode. The second clamping circuit can be configured to resonate when a voltage applied to the drain of the second MOSFET exceeds a breakdown voltage of the second diode.

The high-side transistor circuit can be implemented in a semiconductor die. The first diode can include a plurality of interconnected stripes. The first MOSFET can include a plurality of interconnected stripes. The first inductor can include inductance from at least one of an electrical contact to the anode of the first diode, an electrical contact to a source of the first MOSFET, an electrical connection between a first stripe and a second stripe of the plurality of interconnected stripes of the first diode, an electrical connection between a first stripe and a second stripe of the plurality of interconnected stripes of the first MOSFET, or an electrical connection between the anode of the first diode and the source of the first MOSFET.

The low-side transistor circuit can be implemented in a semiconductor die. The second diode can include a plurality of interconnected stripes. The second MOSFET can include a plurality of interconnected stripes. The second inductor can include inductance from at least one of an electrical contact to the anode of the second diode, an electrical contact to a source of the second MOSFET, an electrical connection between a first stripe and a second stripe of the plurality of interconnected stripes of the second diode, an electrical connection between a first stripe and a second stripe of the plurality of interconnected stripes of the second MOSFET, or an electrical connection between the anode of the second diode and the source of the second MOSFET.

In another general aspect, a power converter circuit includes an output impedance circuit, and a half-bridge circuit coupled with the output impedance circuit. The half-bridge circuit includes a high-side transistor circuit and a low-side transistor circuit. The high-side transistor circuit includes a first metal-oxide semiconductor field-effect transistor (MOSFET) having a gate, a source, and a drain. The first MOSFET has a first breakdown voltage. The high-side transistor circuit also includes a first clamping circuit including a first diode having a second breakdown voltage that is less than the first breakdown voltage. A cathode of the first diode is coupled with the drain of the first MOSFET. The first clamping circuit further includes a first inductor having a first terminal coupled with an anode of the first diode, and a second terminal coupled with the source of the first MOSFET. The low-side transistor circuit includes a second MOSFET including a gate, a source, and a drain. The second MOSFET has a third breakdown voltage. The drain of the second MOSFET is coupled with the source of the first MOSFET. The low-side transistor circuit also includes a second clamping circuit including a second diode having a fourth breakdown voltage that is less than the third breakdown voltage. A cathode of the second diode is coupled with the drain of the second MOSFET. The second clamping circuit further includes a second inductor having a first terminal coupled with an anode of the first diode, and a second terminal coupled with the source of the second MOSFET.

Implementations can include one or more of the following features or aspects, alone or in combination. For example, the power converter circuit can be a buck converter circuit. The output impedance circuit can include an output inductor having a first terminal coupled to a switching node of the half-bridge circuit, and a second terminal coupled to an output node of the power converter circuit. The output impedance circuit can include an output capacitor having a first terminal coupled with the output node of the power converter circuit, and a second terminal coupled with the source of the second MOSFET.

The first clamping circuit can be configured to resonate when a voltage applied to the drain of the first MOSFET exceeds a breakdown voltage of the first diode. The second clamping circuit can be configured to resonate when a voltage applied to the drain of the second MOSFET exceeds a breakdown voltage of the second diode.

The first inductor can be configured such that a resonance period of the first clamping circuit is less than an avalanche time of the first diode during operation of the power converter circuit. The second inductor can be configured such that a resonance period of the second clamping circuit is less than an avalanche time of the second diode during operation of the power converter circuit.

The first inductor can have a first inductance and the second inductor can have a second inductance that is greater than the first inductance.

In the drawings, which are not necessarily drawn to scale, like reference symbols may indicate like and/or similar components (elements, structures, etc.) in different views. The drawings illustrate generally, by way of example, but not by way of limitation, various implementations discussed in the present disclosure. Reference symbols shown in one drawing may not be repeated for the same, and/or similar elements in related views. Reference symbols that are repeated in multiple drawings may not be specifically discussed with respect to each of those drawings, but are provided for context between related views. Also, not all like elements in the drawings are specifically referenced with a reference symbol when multiple instances of an element are illustrated.

DETAILED DESCRIPTION

In some implementations, approaches for reducing voltage and current ringing and/or overshoot in transistors included in power converter circuits, such as a synchronous buck direct-current to direct-current (DC-DC) power converters, include use of clamping diodes. For instance, in such implementations, respective clamping diodes are coupled in parallel with each of a high-side (HS) transistor and a low-side (LS) transistor of a half-bridge circuit included in the power converter circuit. Each clamping diode can be a diode with a breakdown voltage that is less than a breakdown voltage of an associated transistor. For instance, such a clamping diode can be configured to enter avalanche breakdown at voltage ($BV_{ka}$) that is lower than a voltage at which an associated transistor enters avalanche breakdown ($BV_{dss}$).

However, as the primary mechanism by which such clamping diodes reduce voltage and current overshoot and/or ringing is via periodic avalanche breakdown of the clamping diode, such approaches can result in an undesired loss of power conversion efficiency (e.g., due to power consumed during the periodic avalanche). Further, this periodic avalanche can result in drift of $BV_{ka}$ of the clamping diode, which could result in increased power loss due to a reduction in $BV_{ka}$, or undesired avalanche occurring in an associated transistor due to an increase in $BV_{ka}$. Accordingly, such $BV_{ka}$ drift can further impact efficiency of the associated power converter, as well as long term reliability of the associated transistor or transistors, e.g., LS and/or HS trench-gate, vertical power metal-oxide-semiconductor field-effect transistors (MOSFETs), as well as associated circuitry of the power converter, such as drivers, controllers, etc.

This disclosure is directed to implementations that address at least some of the concerns noted above (e.g., loss of efficiency, $BV_{ka}$ drift, long term reliability issues). For instance, the implementations described herein provide for affecting discontinuous avalanche in clamping diodes, such as clamping diodes included in HS transistor circuits and/or LS transistor circuits, such the example implementations described herein. This discontinuous avalanche is achieved by inducing resonance in a corresponding clamping diode voltage ($V_{ka}$) and corresponding clamping diode current ($I_{ka}$), e.g., during avalanche of the clamping diode. In example implementations, this resonance is induced (affected, produced, etc.) using at least one inductance (e.g., an inductor, an aggregate of a plurality of distributed inductances, etc.) that is coupled in series with the clamping diode, and in parallel with the corresponding transistor. That is, in some implementations, such as those described herein, a clamping circuit for a HS transistor or a LS transistor can include a clamping diode in series with at least one clamping inductance, where the series coupled diode and inductance are coupled in parallel with an associated transistor (e.g., between a source terminal and a drain terminal of the transistor).

Figure 1:
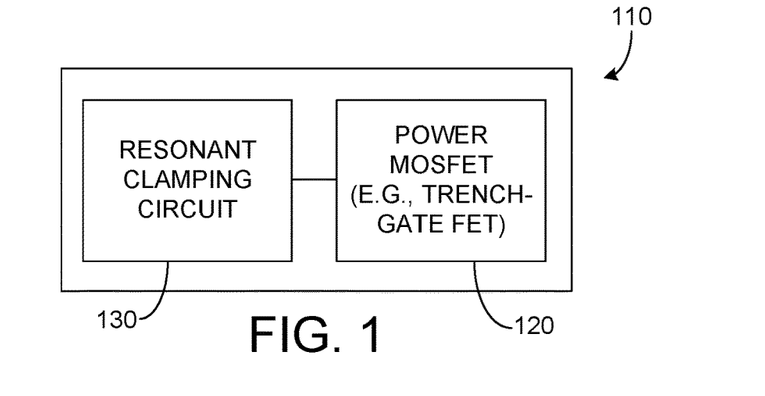
FIG. 1 is a block diagram illustrating an example transistor circuit with a resonant clamping circuit.

FIG. 1 is a block diagram illustrating an example transistor circuit 110 with a resonant clamping circuit. As shown in FIG. 1, the transistor circuit 110 includes a power MOSFET 120 and a resonant clamping circuit 130. In some implementations, the power MOSFET 120 can be a vertical, trench-gate MOSFET, such as an n-channel, power MOSFET. In some implementations, the transistor circuit 110 can be included in a power converter. For instance, respective implementations of the transistor circuit 110 can be included in a power converter as a HS transistor circuit of a corresponding half-bridge circuit, and a LS transistor circuit of the corresponding half-bridge circuit. As noted above, in some implementations, the resonant clamping circuit 130 can include a series coupled diode and inductance (an LD circuit), where the LD circuit is coupled in parallel with the power MOSFET 120, e.g., between a source terminal and a drain terminal of the power MOSFET 120. Example implementations of the transistor circuit 110 are illustrated and described below with respect to, at least, FIGS. 3, 10A-10B, 11A-11B, 12A-12B, 13A-13B and 14A-14B.

In some implementations, the power MOSFET 120 and the resonant clamping circuit 130 can be implemented in a single semiconductor die. In other implementations, the transistor circuit 110 can be implemented in a first semiconductor die, while at least a clamping diode of the resonant clamping circuit 130 can be implemented in a second die. In this example, inductance of the resonant clamping circuit 130 can include, at least, inductance associated with electrical interconnects between the first semiconductor die and the second semiconductor die. For instance, the first semiconductor die and the second semiconductor die can be co-packaged (as multi-chip module in a single package assembly). Interconnects, such as conductive clips, wire bonds, etc., between the first semiconductor die and the second semiconductor die can be configured to provide, at least in part, an inductance of an associated resonant clamping circuit.

Figure 2:
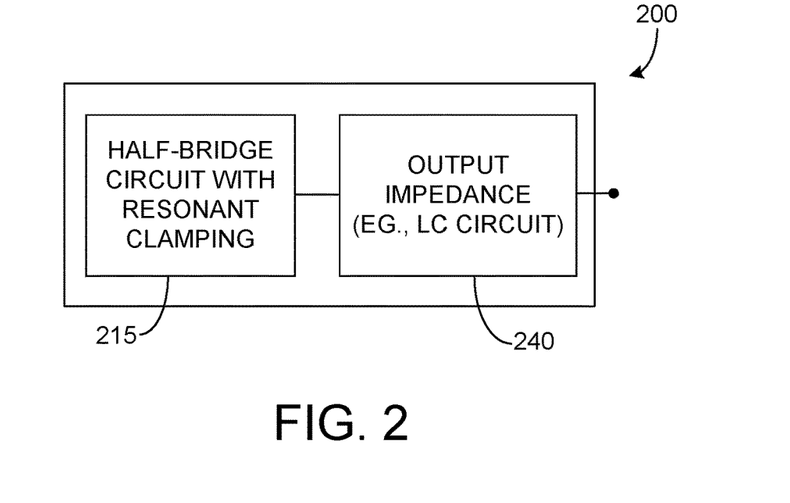
FIG. 2 is a block diagram illustrating an example power converter circuit including a half-bridge circuit that can be implemented using the transistor circuit of FIG. 1.

FIG. 2 is a block diagram illustrating an example power converter circuit 200 that includes a half-bridge circuit 215. In this example, the half-bridge circuit 215 can be implemented using the transistor circuit 110 of FIG. 1. That is, the half-bridge circuit 215 of the power converter circuit 200 can include respective implementations of the transistor circuit 110 for a HS transistor and a LS transistor of the half-bridge circuit 215. For instance, in the power converter circuit 200, each of a LS transistor circuit and a HS transistor circuit of the half-bridge circuit 215 can include a corresponding resonant clamping circuit, such as those described herein. For instance, the half-bridge circuit 215 can be implemented using one or more of the example transistor circuits described and illustrated herein, such as the examples of, at least, FIGS. 3, 10A-10B, 11A-11B, 12A-12B, 13A-13B and 14A-14B.

The power converter circuit 200, as shown in FIG. 2, also includes an output impedance circuit 240, which can be an inductive-capacitive circuit (LC circuit) for achieving power conversion, e.g., DC-DC conversion, based on a signal generated (provided, produced, etc.) on a switching node of the half-bridge circuit 215. For instance, the signal provided on the switching node can be an alternating current signal produced by the half-bridge circuit 215 from an input DC voltage signal. In this example, the power converter circuit 200 can be a synchronous buck converter, though, in some implementations, the power converter circuit 200 can implement other types of power converters, such as boost converters.

Figure 3:
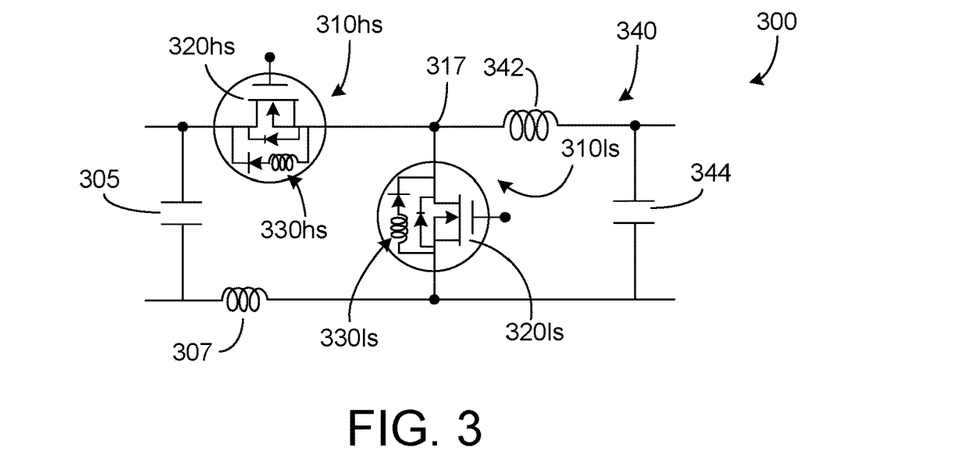
FIG. 3 is a schematic diagram illustrating an example power converter circuit, which can implement the power converter circuit of FIG. 2.

FIG. 3 is a schematic diagram illustrating an example power converter circuit 300, which can be an implementation of the power converter circuit 200 of FIG. 2. As shown in FIG. 3, the power converter circuit 300 includes an input capacitance 305, an inductor 307, a HS transistor circuit 310hs, a LS transistor circuit 310ls, a switching node 317 (disposed between the HS transistor circuit 310hs and the LS transistor circuit 310ls), and an output impedance circuit 340. In this example, the input capacitance 305 can include capacitance of the HS transistor circuit 310hs and the LS transistor circuit 310ls, as well as capacitance of a main power loop of the power converter circuit 300. In this example, the inductor 307 can include a stray inductance of the main power loop of the power converter circuit 300.

As shown in FIG. 3, the HS transistor circuit 310hs includes a transistor 320hs (with a corresponding body diode shown) and a resonant clamping circuit 330hs, while the LS transistor circuit 310ls includes a transistor 320ls (with a corresponding body diode shown) and a resonant clamping circuit 330ls. In this example, the transistor 320hs and the transistor 320ls can be respective vertical, trench-gate MOSFETs. Also in this example, the resonant clamping circuit 330hs and the resonant clamping circuit 330ls can be respective LD circuits (e.g., series coupled diode and inductance). Further in the power converter circuit 300, the output impedance circuit 340 includes an inductor 342 and a capacitor 344, which are configured to provide a desired DC-DC power conversion ratio, e.g., step down of an input DC voltage to a desired output DC voltage.

Figure 4:
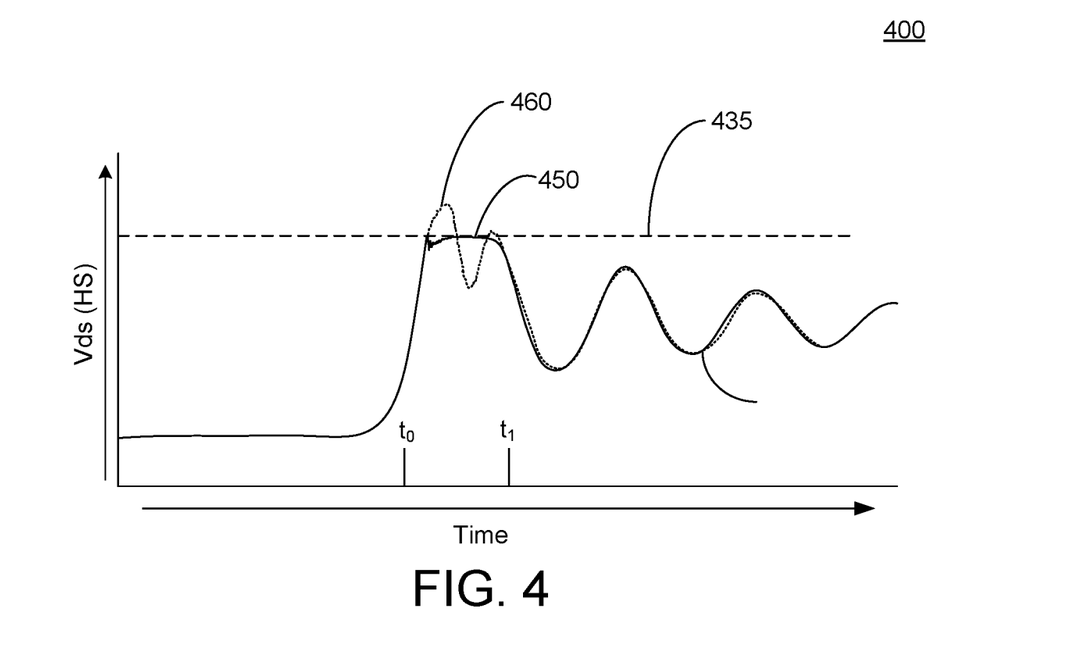
FIG. 4 is a graph comparing operation of an implementation of the transistor circuit of FIG. 1, as a high-side transistor, with a comparable transistor circuit with a non-resonant clamping circuit in a power converter circuit.

FIG. 4 is a graph 400 comparing operation of an implementation of the transistor circuit of FIG. 1, such as the HS transistor circuit 310hs of FIG. 3, with a comparable transistor circuit with a non-resonant clamping circuit (e.g., clamping diode only), when implemented as a HS transistor circuit in a power converter circuit (e.g., the power converter circuit 300). In FIG. 4, time is indicated on the x-axis (increasing left to right), while drain-to-source voltage $V_{ds}$ of the HS transistor is indicated on the y-axis (increasing bottom to top). The values in the graph 400 are normalized, and the specific values of time and $V_{ds}$ will depend on the particular implementation.

In the graph 400, the dashed line 435 indicates a $BV_{ka}$ of respective clamping diodes of the example transistor circuits illustrated in the graph 400. The trace 450 illustrates $V_{ds}$ for a transistor circuit with a non-resonant clamping circuit, and the trace 460 illustrates $V_{ds}$ for a transistor circuit with a resonant clamping circuit, e.g., the HS transistor circuit 310hs of the power converter circuit 300 with a fixed clamping inductance. A value of the clamping inductance in this example will depend on the particular implementation. In some implementations, a clamping inductance of a HS transistor circuit, such as the HS transistor circuit 310hs, can be in a range of 0.01 nanohenries (nH) to 1 nH.

As can be seen by a comparison of the trace 450 with the trace 460, for the transistor circuit with a non-resonant clamping circuit (trace 450), an associated clamping diode operates in avalanche for the period of time from $t_0$ to $t_1$, as is indicated by $V_{ds}$ (which corresponds with $V_{ka}$ and $I_{ka}$). In comparison, the transistor circuit with a resonant clamping circuit (trace 460), due to the induced resonance of $V_{ds}$ (via induced resonance of $V_{ka}$ and $I_{ka}$), operates in avalanche approximately half of the period of time from $t_0$ to $t_1$. This reduction in the amount of time of periodic avalanche for the transistor circuit associated with the trace 460 (e.g., repeatedly over an operation period of an associated power converter circuit) can improve power conversion efficiency (e.g., a ratio of output power to input power), as well as reduce detrimental effects, such as $BV_{k}$a shift, avalanche occurring in the HS transistor, etc.

Figure 5:
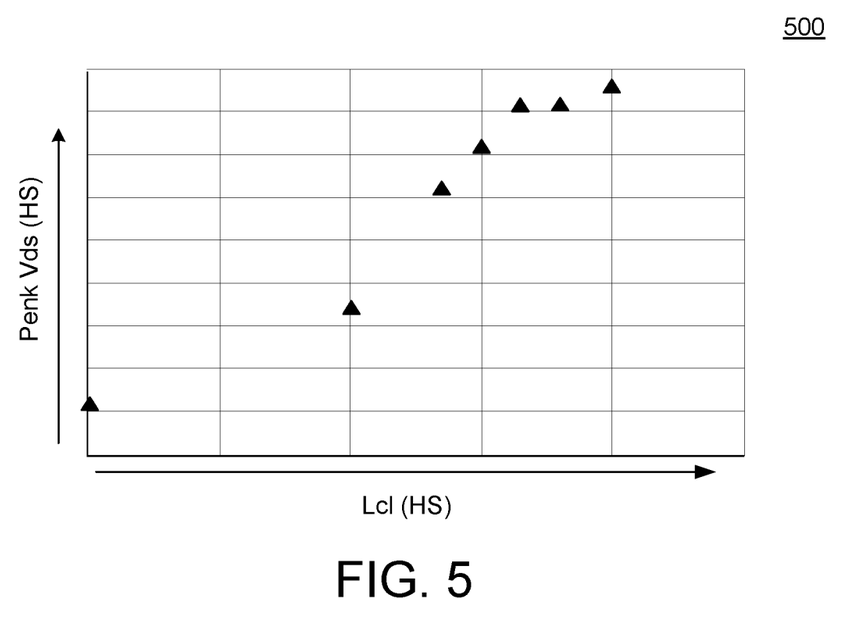
FIG. 5 is a graph illustrating peak drain-to-source voltage versus clamping inductance for an implementation of the transistor circuit of FIG. 1 as a high-side transistor.

FIG. 5 is a graph 500 illustrating peak $V_{ds}$ versus clamping inductance for an implementation of the transistor circuit of FIG. 1 as a high-side transistor circuit, such as for the HS transistor circuit 310hs of the power converter circuit 300 shown in FIG. 3. That is, in the graph 500, values of clamping inductance are indicated on the x-axis (increasing left to right), while corresponding peak $V_{ds}$ values are indicated on the y-axis (increasing bottom to top). The values in the graph 500 are normalized, and the specific values of clamping inductance and peak $V_{ds}$ will depend on the particular implementation. As shown in FIG. 5 increasing clamping inductance for a HS transistor circuit results in corresponding increases in peak $V_{ds}$. Accordingly, the value of the clamping inductance for a HS transistor circuit in this example (e.g., a synchronous buck converter, such as the power converter circuit 300) should be tuned (configured, adjusted, etc.) such that a corresponding peak $V_{ds}$ value does not result in continuous avalanche (e.g., trace 450 in FIG. 4) occurring in a corresponding HS transistor during operation of the power converter circuit.

Figure 6:
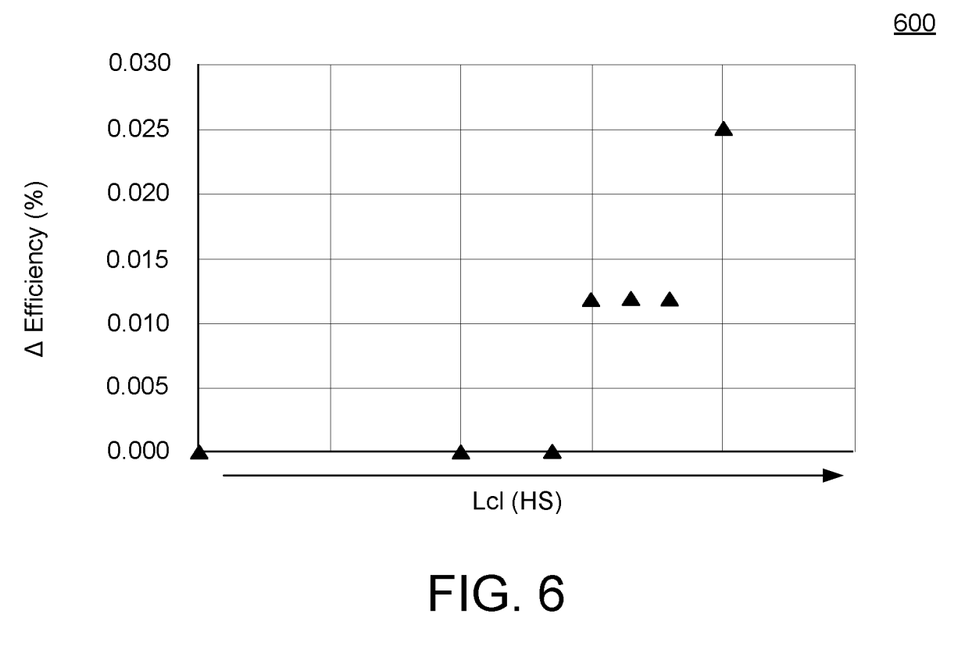
FIG. 6 is a graph illustrating change in power-conversion efficiency for an implementation of the transistor circuit of FIG. 1, as a high-side transistor, versus clamping inductance compared to efficiency of a comparable transistor circuit with a non-resonant clamping circuit.

FIG. 6 is a graph 600 illustrating changes in power-conversion efficiency (Δ Efficiency) versus HS clamping inductance for a power conversion circuit including an implementation of the transistor circuit of FIG. 1, e.g., as a HS transistor circuit. In this example, Δ Efficiency illustrated by the graph 600 is as compared to power-conversion efficiency of a comparable power conversion circuit with a HS transistor circuit with a non-resonant clamping circuit. That is, in the graph 600, values of clamping inductance are indicated on the x-axis (increasing left to right), while corresponding Δ Efficiency values are indicated on the y-axis. The clamping inductance values in the graph 600 are normalized, and the specific values of clamping inductance will depend on the particular implementation. The x-axis scale in the graph 600 is normalized to be consistent with the x-axis scale of FIG. 5. As can be seen from the graph 500 and the graph 600, increasing clamping inductance for the HS transistor circuit in this example provides small increases in Δ Efficiency (versus use of a non-resonant clamping circuit) while increasing peak $V_{ds}$. Accordingly, any efficiency benefit associated with an increased HS clamping inductance may be outweighed by a corresponding increase in peak $V_{ds}$.

Figure 7:
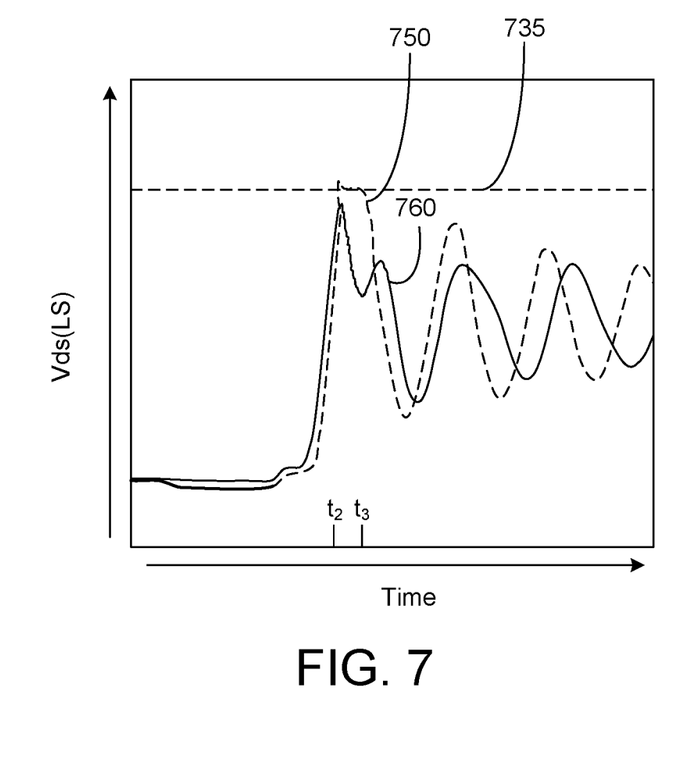
FIG. 7 is a graph comparing operation of an implementation of the transistor circuit of FIG. 1, as a low-side transistor, with a comparable transistor circuit with a non-resonant clamping circuit in a power converter circuit.

FIG. 7 is a graph comparing operation of an implementation of the transistor circuit of FIG. 1, such as the LS transistor circuit 310ls of FIG. 3, with a comparable transistor circuit with a non-resonant clamping circuit (e.g., clamping diode only), when implemented as a LS transistor circuit in a power converter circuit (e.g., the power converter circuit 300). In FIG. 7, time is indicated on the x-axis (increasing left to right), while $V_{ds}$ of the LS transistor is indicated on the y-axis (increasing bottom to top). The values in the graph of FIG. 7 are normalized, and the specific values of time and $V_{ds}$s will depend on the particular implementation.

In the graph of FIG. 7, the dashed line 735 indicates a $BV_{ka}$ of respective clamping diodes of the example transistor circuits illustrated. The trace 750 illustrates $V_{ds}$ for a transistor circuit with a non-resonant clamping circuit, and the trace 760 illustrates $V_{ds}$ for a transistor circuit with a resonant clamping circuit, e.g., the LS transistor circuit 3101s of the power converter circuit 300 with a fixed clamping inductance. A value of the clamping inductance in this example will depend on the particular implementation. In some implementations, a clamping inductance of a LS transistor circuit, such as the LS transistor circuit 3101s, can be in a range of 0.01 nanohenries (nH) to 1 nH. That is, in some implementations, such as those described herein, a clamping inductance that is implemented for a LS transistor circuit can be larger (e.g., 4-5 time larger) than a clamping inductance implemented for a corresponding HS transistor circuit. This difference can be due, at least in part, to HS transistors and LS side transistors being sized differently in a power conversion circuit. e.g., a larger transistor (e.g., higher current capacity with associated higher capacitance) being used for a LS transistor circuit than a relatively smaller transistor that is used for implementing a corresponding HS transistor circuit.

As can be seen by a comparison of the trace 750 with the trace 760, for the transistor circuit with a non-resonant clamping circuit (trace 750), an associated clamping diode operates in avalanche for the period of time from $t_2$ to $t_3$, as is indicated by $V_{ds}$ (which corresponds with $V_{ka}$ and $I_{ka}$). In comparison, the transistor circuit with a resonant clamping circuit (trace 760), due to the induced resonance of $V_{ds}$ (via induced resonance of $V_{ka}$ and $I_{ka}$), operates in avalanche approximately half of the period of time from $t_2$ to $t_3$. As was discussed above with respect to FIG. 4, this reduction in the amount of time of periodic avalanche for the transistor circuit associated with the trace 760 (e.g., repeatedly over an operation period of an associated power converter circuit) can improve power conversion efficiency (e.g., a ratio of output power to input power), as well as reduce detrimental effects, such as $BV_{ka}$ shift, avalanche occurring in the HS transistor, etc.

Figure 8:
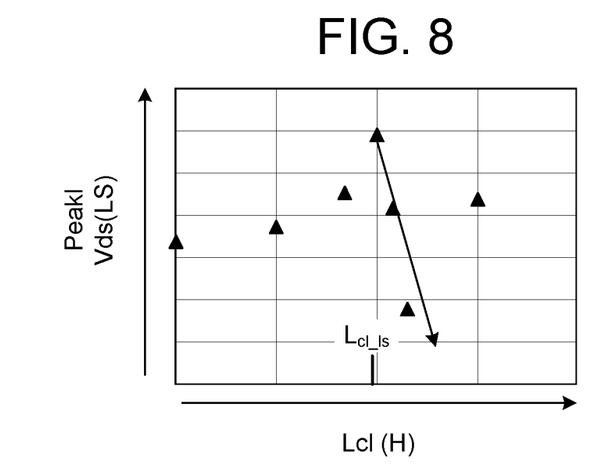
FIG. 8 is a graph illustrating peak drain-to-source voltage versus clamping inductance for an implementation of the transistor circuit of FIG. 1 as a low-side transistor.

FIG. 8 is a graph illustrating peak $V_{ds}$ versus clamping inductance for an implementation of the transistor circuit of FIG. 1 as a LS transistor circuit, such as for the LS transistor circuit 3101s of the power converter circuit 300 shown in FIG. 3. That is, in the graph of FIG. 8, values of clamping inductance are indicated on the x-axis (increasing left to right), while corresponding peak $V_{ds}$ values are indicated on the y-axis (increasing bottom to top). The values in FIG. 8 are normalized, and the specific values of clamping inductance and peak $V_{ds}$ will depend on the particular implementation. As shown in FIG. 8, increasing clamping inductance for a LS transistor circuit initially results in corresponding increases in peak $V_{ds}$ and then, at a clamping inductance of approximately $L_{cl\_is}$, a decrease in peak $V_{ds}$ occurs. Accordingly, the value of the clamping inductance for a LS transistor circuit in this example (e.g., a synchronous buck converter, such as the power converter circuit 300) can be tuned (configured, adjusted, etc.) so as to benefit from such a decrease in a corresponding peak $V_{ds}$ value. As shown in FIG. 8, some variation in peak $V_{ds}$ can be observed. Such variation can be due to interference between a signal in a circuit loop including a clamping diode, a clamping inductance and $C_{oss}$ of a MOSFET, and a signal in a main power loop. That is, when varying a value of the clamping inductance (Lcl), peak $V_{ds}$ can fluctuate due to such interference changing from constructive to destructive and vice versa.

Figure 9:
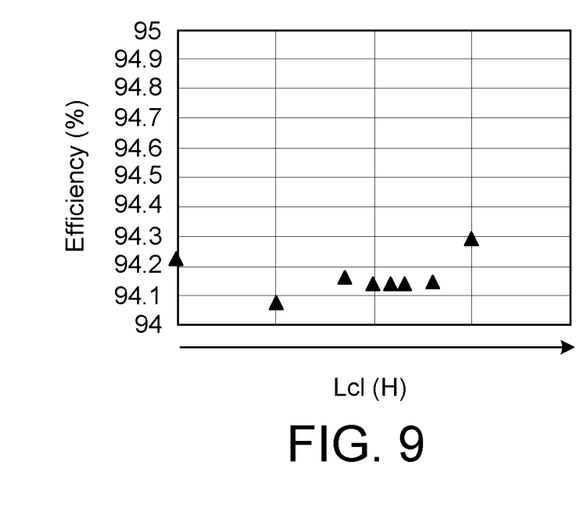
FIG. 9 is a graph illustrating power-use efficiency for an implementation of the transistor circuit of FIG. 1, as a low-side transistor, versus clamping inductance.

FIG. 9 is a graph illustrating power-conversion efficiency (percentage conversion efficiency) versus LS clamping inductance for a power conversion circuit including an implementation of the transistor circuit of FIG. 1, e.g., as a LS transistor circuit. In this example, power-conversion efficiency (in percentage), as illustrated by the graph in FIG. 9, does not significantly change as a LS clamping inductance is increased. For instance, as shown in FIG. 9, an approximately 0.2% variation was observed over the illustrated range, which covers more than three orders of magnitude of variation in LS clamping inductance. Accordingly, the benefit of reduced peak $V_{ds}$ associated with an increased LS clamping inductance does not cause a significant change (e.g., decrease) in associated power conversion efficiency.

In addition to the above discussed considerations (e.g., efficiency and peak $V_{ds}$), resonance period should also be considered with selecting clamping inductance values for resonant clamping circuits. For instance, clamping inductance values should be selected such that a period of resonance ($T_{RES}$) of an associated clamping circuit is less than an avalanche time $T_{AVALANCHE}$ for a corresponding clamping diode.

Referring to the power converter circuit 300 of FIG. 3 as an example, in some implementations, e.g., where respective output capacitances of the clamping diodes of the HS transistor circuit 310hs and the LS transistor circuit 3101s are negligible as compared to respective output capacitances $C_{OSS}$ of the corresponding HS transistor 320hs and the corresponding LS transistor 3201s, $T_{RES}$ can be given by:

$$T_{RES} = 2\pi\sqrt{L_{CL} \cdot C_{OSS}}$$

for each of the HS transistor circuit 310hs (where $C_{OSS}$ is the output capacitance of the transistor 320hs), and the LS transistor circuit 3101s (where $C_{OSS}$ is the output capacitance of the transistor 3201s).

Further in this example, due to the sizing of the HS transistor 320hs as compared to the sizing of the LS transistor 3201s, as well as their arrangement in the power converter circuit 300, calculation of the avalanche time for each of the HS transistor circuit 310hs and the LS transistor circuit 3101s is significantly different. For instance, avalanche time for the LS transistor circuit 3101s can be given (approximately) by:

$$T_{AVALANCHE\_LS} \sim \pi\sqrt{L_{STRAY} \cdot C_{OSS\_LS}}$$

where $L_{STRAY}$ is an inductance value of the inductor 307 and $C_{OSS\_LS}$ is the output capacitance of the transistor 3201s.

Avalanche time for the HS transistor circuit 310hs can be given by:

$$T_{AVALANCHE\_HS} = L_{STRAY} \cdot \left(\frac{I_{LOAD} \cdot \alpha}{BV_{KA} - V_{IN}}\right)$$

where $L_{STRAY}$ is the inductance value of the inductor 307, $I_{LOAD}$ is an output current of the power converter circuit 300, $\alpha$ is a factor indicating a percentage of $I_{LOAD}$ that is avalanche current, $BV_{KA}$ is the breakdown (avalanche) voltage of the HS clamping diode, and $V_{IN}$ is the input voltage of the power converter circuit 300 (e.g., the voltage being converted). Accordingly, to achieve desired values of $T_{RES}$ for the HS transistor circuit 310hs and the LS transistor circuit 3101s, different values of clamping inductance may be used, e.g., based on the foregoing provided equations.

Example implementations of various transistor circuits with resonant clamping circuits (e.g., implementations of the transistor circuit 110) are respectively illustrated in FIGS. 10A-10B, 11A-11B, 12A-12B, 13A-13B and 14A-14B. Each of these respective implementations is illustrated as a circuit schematic (FIGS. 10A, 11A, 12A, 13A and 14A), and as a hybrid diagram including circuit schematic elements in combination with cross-sectional semiconductor device views (FIGS. 10B, 11B, 12B, 13B and 14B). Each of the illustrated example transistor circuits includes a MOSFET, a clamping diode and at least one clamping inductance. Some of the example implementations also include a resistor and/or a capacitor in their resonant clamping circuit. Various approaches can be used for implementing these elements. For instance, in some implementations, clamping inductances can include inductance from different metal structures, such as contacts, electrical interconnects, and/or other structures, such as metal spirals formed in a semiconductor device. In some implementations, resistors can be implemented using polysilicon structures, diffusion structures, metal structures, etc. In some implementations, capacitors can be implemented using polysilicon electrodes disposed in dielectric lined trenches that are formed in highly doped semiconductor regions, or can be implemented with a dielectric (e.g., oxide) disposed between two conductive plates (e.g., metal plate and/or doped polysilicon plates). The foregoing are provided by way of example, and other approaches for implementing the elements of the example transistor circuits of FIGS. 10A-10B, 11A-11B, 12A-12B, 13A-13B and 14A-14B are possible.

Also, for purposes of illustration and by way of example, same semiconductor device structures (clamping diode and trench-gate MOSFET structures) are illustrated in the hybrid diagrams of FIGS. 10B, 11B, 12B, 13B and 14B. In some implementations, structures other than those illustrated could be used. Further, certain aspects of the MOSFET (e.g., gate, source and drain terminals) and the clamping diode (anode and cathode) of the example transistor circuits are referenced in, and discussed with respect to FIGS. 10A and 10B. However, for purposes of brevity and clarity, these elements may not be specifically referenced and/or described with respect to the other example transistor circuit implementations of FIGS. 11A-11B, 12A-12B, 13A-13B and 14A-14B.

Figures 10A, 10B:
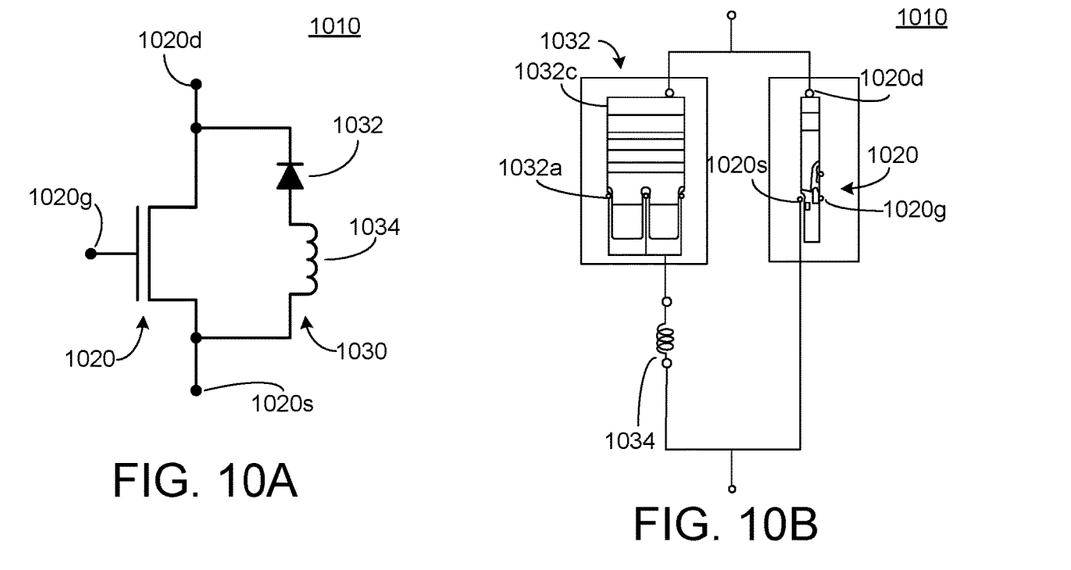
FIGS. 10A and 10B are diagrams illustrating an example transistor circuit with resonant clamping, such as the transistor circuits of the power converter circuit of FIG. 3.

FIGS. 10A and 10B are diagrams illustrating an example transistor circuit 1010 with resonant clamping, such as the transistor circuits (HS transistor circuit 310hs and LS transistor circuit 310ls) of the power converter circuit 300 of FIG. 3. As shown in FIGS. 10A and 10B, the transistor circuit 1010 includes a power MOSFET 1020 and a resonant clamping circuit 1030. The power MOSFET 1020 includes a gate terminal 1020g, a drain terminal 1020d and a source terminal 1020s, which are referenced in both FIGS. 10A and 10B. As discussed herein, the power MOSFET 1020 can be a vertical, trench-gate MOSFET, as shown by the cross-sectional semiconductor structure view of FIG. 10B. As further shown in in FIGS. 10A and 10B, the resonant clamping circuit 1030 includes a clamping diode 1032 and a clamping inductance 1034, which are coupled in series with one another. That is, a first terminal of the clamping inductance 1034 is coupled with the source terminal 1020s of the power MOSFET 1020, while a second terminal of the clamping inductance 1034 is coupled with an anode terminal 1032a of the clamping diode 1032.

As also shown in FIGS. 10A and 10B, a cathode terminal 1032c of the clamping diode 1032 is coupled with the drain terminal 1020d of the power MOSFET 1020. That is, the series coupled clamping diode 1032 and clamping inductance 1034 of the resonant clamping circuit 1030 are coupled in parallel with the power MOSFET 1020. As shown in FIG. 10B, the clamping diode 1032 can be implemented with the anode terminal 1032a being a heavily doped p-type region disposed on the cathode terminal 1032c that is implemented by an n-type region (e.g., and epitaxially formed region). It is noted that in FIG. 10B (as well as FIGS. 11B, 12B, 13B and 14B) the cross-sectional views of the corresponding clamping diodes and the MOSFETs are shown inverted. That is, in these diagrams, back sides (bottom sides) of a corresponding semiconductor die (or separate die) are shown at respective tops of the structures in the illustrated views.

Figure 11A:
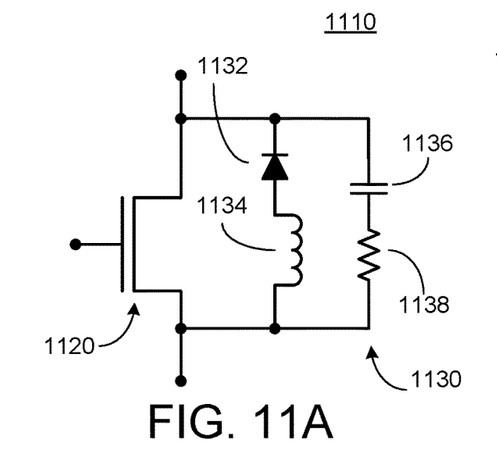
FIGS. 11A and 11B are diagrams illustrating another example transistor circuit with resonant clamping.
Figure 11B:
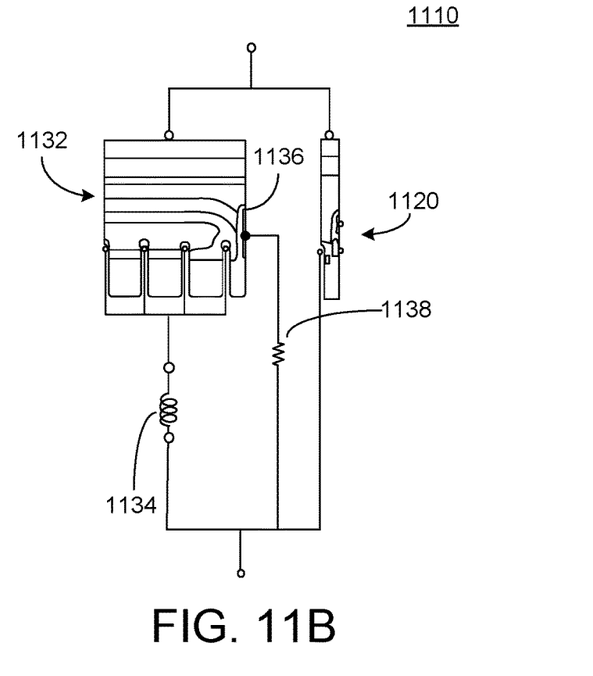

FIGS. 11A and 11B are diagrams illustrating another example transistor circuit 1110 with resonant clamping. As with the transistor circuit 1010, the transistor circuit 1110 includes a power MOSFET 1120, and a resonant clamping circuit 1130, including a clamping diode 1132 and a clamping inductance 1134, which are connected in a same arrangement as the corresponding elements of the transistor circuit 1010. Accordingly, for purposes of brevity, those like elements are not described in detail again with respect to FIGS. 11A and 11B.

In addition to the above elements, the transistor circuit 1110 includes a resistive-capacitive (RC) circuit branch that is connected in parallel with the power MOSFET 1120 (as well as in parallel with the LD circuit including the clamping diode 1132 and the clamping inductance 1134). As shown in FIGS. 11A and 11B, the RC circuit branch can include a capacitor 1136 and a resistor 1138. The capacitor 1136, as shown in FIG. 11B, can be implemented by a polysilicon electrode that is disposed in a dielectric lined trench included at an edge of the clamping diode 1132. The resistor 1138 can be implemented, at least in part, by a resistance of the poly electrode of the capacitor 1136. In this example, the RC circuit branch can modulate resonance of the resonant clamping circuit 1130.

Figure 12A:
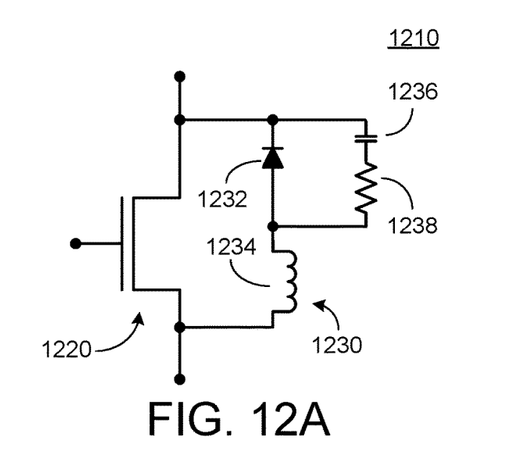
FIGS. 12A and 12B are diagrams illustrating another example transistor circuit with resonant clamping.
Figure 12B:
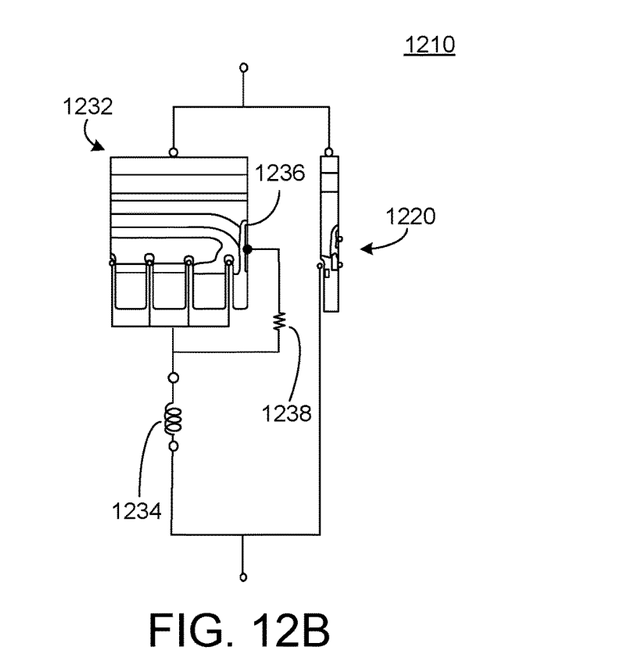

FIGS. 12A and 12B are diagrams illustrating another example transistor circuit 1210 with resonant clamping. As with the transistor circuit 1010 and the transistor circuit 1110, the transistor circuit 1210 includes a power MOSFET 1220, and a resonant clamping circuit 1230, including a clamping diode 1232 and a clamping inductance 1234, which are connected in a same arrangement as the corresponding elements of the transistor circuit 1010 and the transistor circuit 1110. Accordingly, for purposes of brevity, those like elements are not described in detail again with respect to FIGS. 12A and 12B.

In addition to the above elements, the transistor circuit 1210 includes a resistive-capacitive (RC) circuit branch that is connected in parallel with the clamping diode 1232, and in series with the clamping inductance 1234. As shown in FIGS. 12A and 12B, the RC circuit branch can include a capacitor 1236 and a resistor 1238. The capacitor 1236, as shown in FIG. 12B, as with the capacitor 1136, can be implemented by a polysilicon electrode that is disposed in a dielectric lined trench included at an edge of the clamping diode 1232. The resistor 1238, as with the resistor 1138, can be implemented, at least in part, by a resistance of the poly electrode of the capacitor 1236. In this example, as with the RC circuit branch of the transistor circuit 1110, the RC circuit branch of the transistor circuit 1210 can modulate resonance of the resonant clamping circuit 1230.

Figures 13A, 13B:
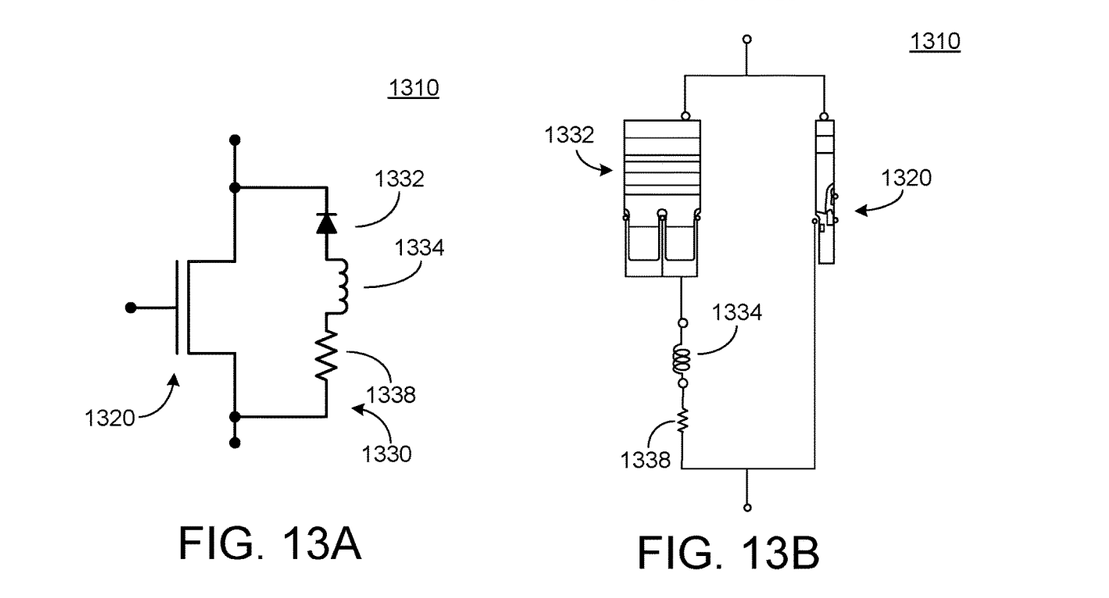
FIGS. 13A and 13B are diagrams illustrating another example transistor circuit with resonant clamping.

FIGS. 13A and 13B are diagrams illustrating another example transistor circuit 1310 with resonant clamping. As with the transistor circuit 1010, the transistor circuit 1110, and the transistor circuit 1210, the transistor circuit 1310 includes a power MOSFET 1320, and a resonant clamping circuit 1330, including a clamping diode 1332 and a clamping inductance 1334, which are connected in a same arrangement as the corresponding elements of the transistor circuit 1010, the transistor circuit 1110, and the transistor circuit 1210. Accordingly, for purposes of brevity, those like elements are not described in detail again with respect to FIGS. 13A and 13B.

In addition to the above elements, the transistor circuit 1210 includes a frequency-dependent resistor 1338 that is coupled in series with the clamping diode 1332 and the clamping inductance 1334. In this example, the frequency-dependent resistor 1338 can provide resonance damping for the resonant clamping circuit 1330 of the transistor circuit 1310. In some implementations, the frequency-dependent resistor 1338 can be implemented, e.g., using metal vias with a thickness and width engineered to enhance a skin effect and, as a result, a resistance dependence with frequency.

Figure 14A:
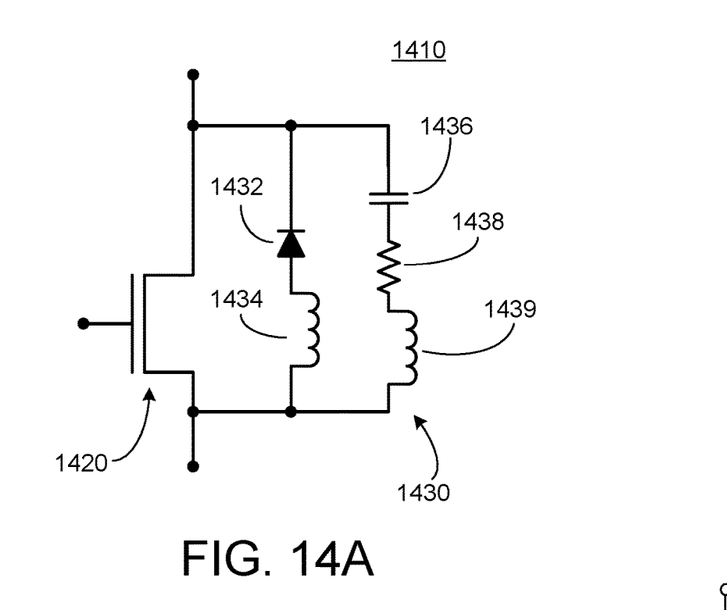
FIGS. 14A and 14B are diagrams illustrating another example transistor circuit with resonant clamping.
Figure 14B:
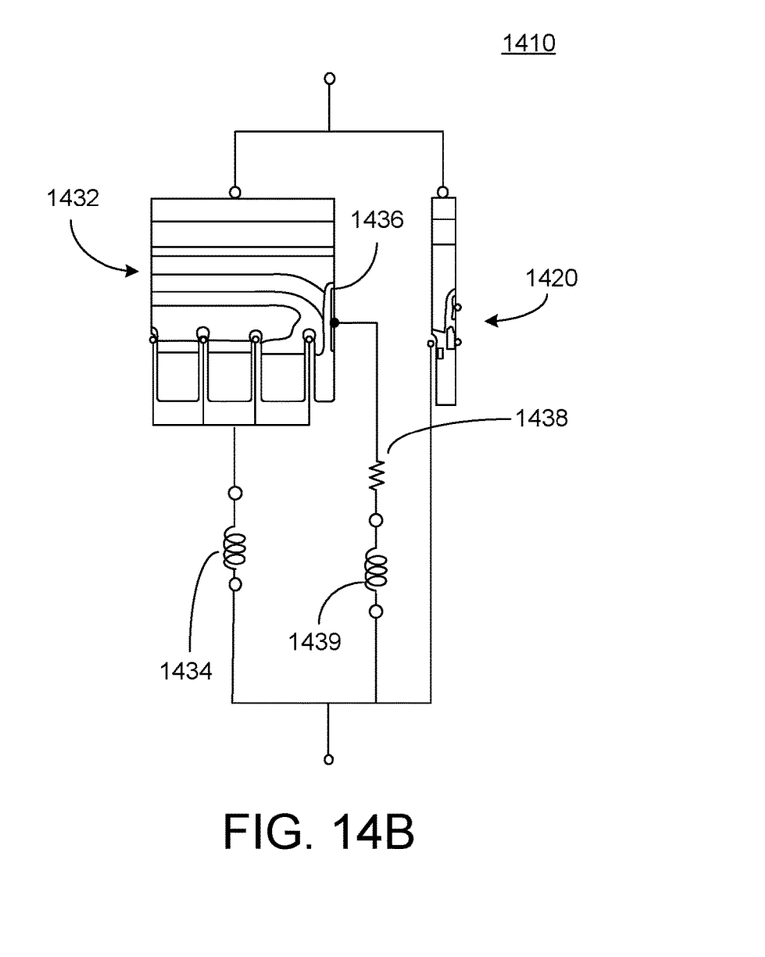

FIGS. 14A and 14B are diagrams illustrating another example transistor circuit 1410 with resonant clamping. As with the transistor circuit 1010, the transistor circuit 1110, the transistor circuit 1210, and the transistor circuit 1310, the transistor circuit 1410 includes a power MOSFET 1420, and a resonant clamping circuit 1430, including a clamping diode 1432 and a clamping inductance 1434, which are connected in a same arrangement as the corresponding elements of the transistor circuit 1010, the transistor circuit 1110, the transistor circuit 1210, and the transistor circuit 1310. Accordingly, for purposes of brevity, those like elements are not described in detail again with respect to FIGS. 14A and 14B.

In addition to the above elements, the transistor circuit 1410 includes a resistive-inductive-capacitive (RLC) circuit branch that is connected in parallel with the power MOSFET 1420 (as well as in parallel with the LD circuit including the clamping diode 1432 and the clamping inductance 1434). As shown in FIGS. 14A a 14B, the RLC circuit branch can include a capacitor 1436, a resistor 1438, and an inductor 1439. The elements of the RLC circuit branch of the transistor circuit 1410 can be implemented, for example, using the approaches describe herein. For instance, the capacitor 1436, as shown in FIG. 14B, can be implemented by a polysilicon electrode that is disposed in a dielectric lined trench included at an edge of the clamping diode 1432. The resistor 1438 can be implemented, at least in part, by a resistance of the poly electrode of the capacitor 1136. The inductor 1439 can be implemented using inductance of, e.g., one or more metal structures, such as using the approaches described herein. In this example, the RLC circuit branch can provide resonance damping and/or resonance modulation for the resonant clamping circuit 1430. In some implementations, the inductor 1439 can have an inductance that is greater than the inductance of the inductor 1434.

Figure 15A:
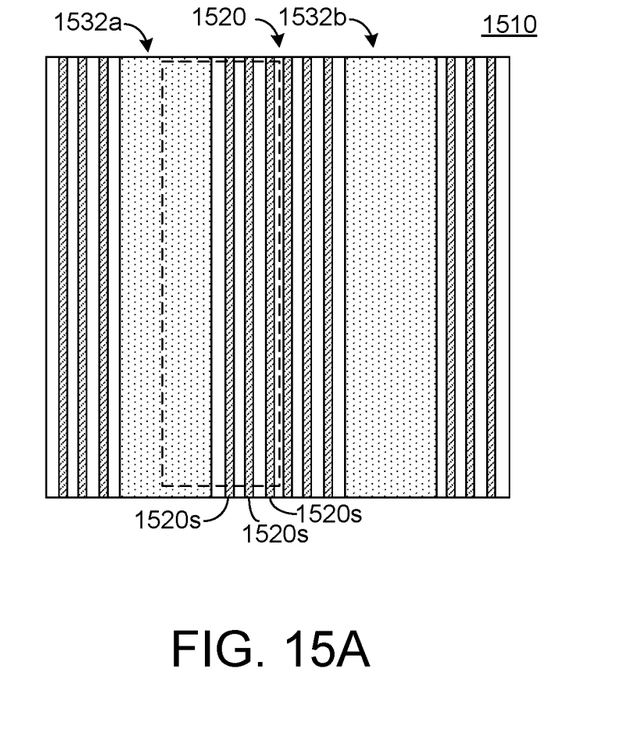
FIGS. 15A and 15B are diagrams illustrating an example approach for implementation of a clamping inductance in a transistor circuit, such as the transistor circuit of FIGS. 10A and 10B.
Figure 15B:
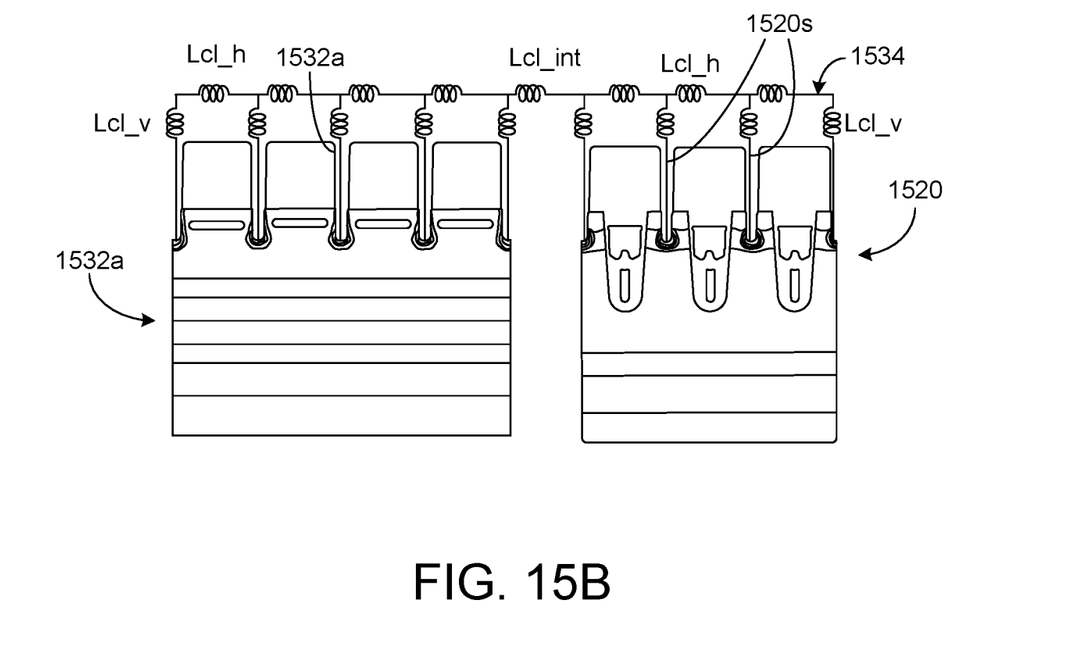

FIGS. 15A and 15B are diagrams illustrating an example approach for implementation of a clamping inductance in a transistor circuit, such as the transistor circuits of FIGS. 10A-10B, 11A-11B, 12A-12B, 13A-13B and 14A-14B. FIG. 15A schematically illustrates a top view of a transistor circuit 1510 with resonant clamping, which can be included in the example implementations described herein. As shown in FIG. 15A, the transistor circuit 1510 includes a plurality of stripes of a clamping diode, e.g., a stripe 1532a, and a stripe 1532b. In this example, the stripe 1532a and the stripe 1532b can be interconnected, e.g., by an overlying metal layer (not shown in FIGS. 15A and 15B), such as a source metal layer for a power MOSFET 1520 of the transistor circuit 1510. In this example, the power MOSFET 1520 also includes a plurality of stripes, indicated by gate trenches 1520s, which stripes can be interconnected (e.g., via the overlying source metal layer) to form the corresponding power MOSFET 1520.

As shown in FIG. 15B, which illustrates side, cross-sectional views of semiconductor structures of the portion of the transistor circuit 1510 indicated by the dashed line inset shown in FIG. 15A (e.g., including the stripe 1532a of the clamping diode, and a portion of the power MOSFET 1520). The semiconductor structures shown in FIG. 15B are similar to those of the transistor circuit 1010, the transistor circuit 1110, the transistor circuit 1210, the transistor circuit 1310 and the transistor circuit 1410 shown, respectively, in FIGS. 10B, 11B, 12B, 13B and 14B. However, in the view of FIG. 15B, those views are shown inverted from the views of FIGS. 10B, 11B, 12B, 13B and 14B (e.g., with respective back sides of the associated semiconductor die being at the bottoms of the structures in the view in FIG. 15B).

As shown in FIG. 15B, a clamping inductance 1534 of a resonant clamping circuit of the transistor circuit 1510 can be a distributed inductance, including a plurality of $L_{cl\_v}$ inductances, a plurality of $L_{cl\_h}$ inductances, and at least one $L_{cl\_int}$ inductance, which can be aggregated as the clamping inductance 1534 ($L_{cl}$). In some implementations, the $L_{cl\_v}$ inductances can be inductances that are associated with electrical contacts, e.g., anode contacts of the clamping diode and/or contacts to source diffusion (and a body region) of the power MOSFET 1520. Further, the $L_{cl\_h}$ inductances can be inductances that are associated with electrical interconnects between diode stripes and/or power MOSFET stripes (e.g., between anode contacts and/or between source contacts). Still further, the at least one $L_{cl\_int}$ inductance can be an inductance(s) associated with electrical interconnects between a clamping diode (e.g., the stripe 1532a and/or the stripe 1532b) and the power MOSFET 1520. For instance, such interconnects can be intra-die (e.g., within a same semiconductor) or inter-die (e.g., between separate die that are co-packaged or separately packaged).

Figure 16:
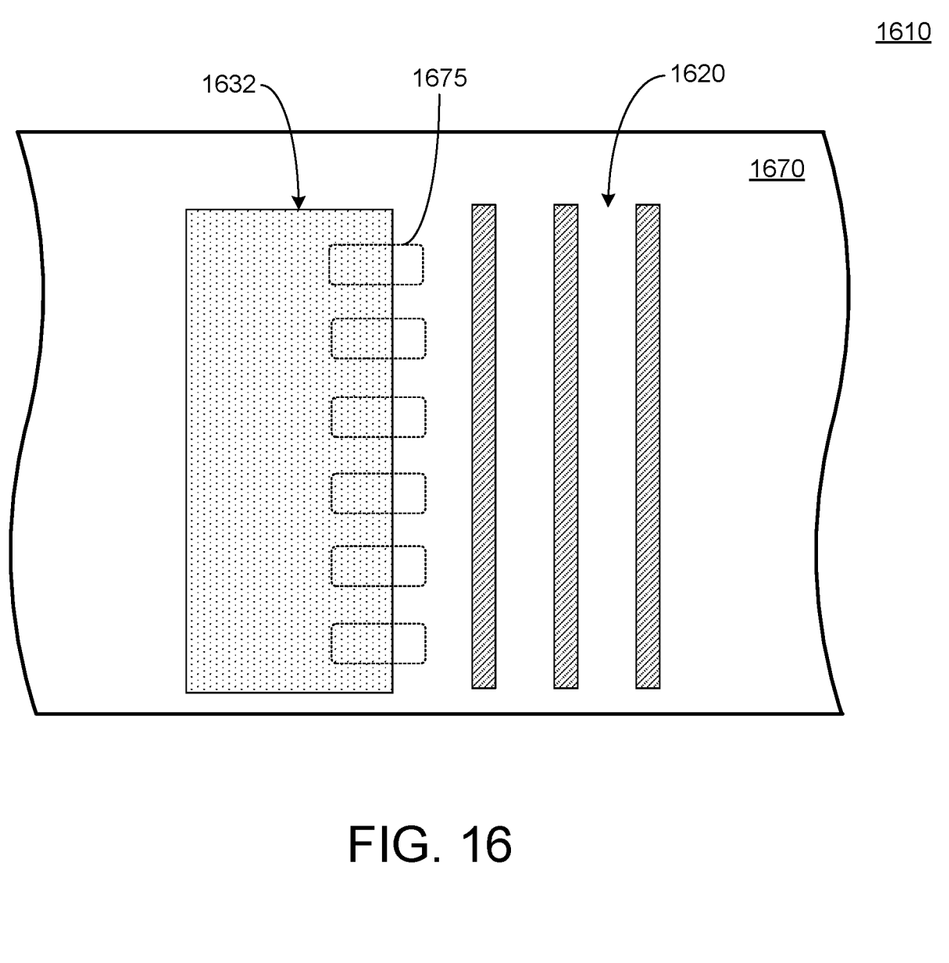
FIG. 16 is a diagram illustrating an example of adjusting a clamping inductance of a transistor circuit.

FIG. 16 is a diagram illustrating an example of adjusting a clamping inductance of a transistor circuit. In the example of FIG. 16, a portion of a transistor circuit 1610 is shown, where the transistor circuit 1610 is similar to the transistor circuit 1510 of FIGS. 15A and 15B. For instance, in the view of FIG. 16, the illustrate portion of the transistor circuit 1610 includes a stripe 1632 of a clamping diode and a portion of a power MOSFET 1620 (e.g., a plurality of MOSFET stripes). Also shown in FIG. 16 is an overlying metal layer 1670 (e.g., source metal layer for the power MOSFET 1620), which can interconnect the stripe 1632 with the power MOSFET 1620, and can have an inductance corresponding with the at least one $L_{cl\_int}$ of the transistor circuit 1510 of FIGS. 15A and 15B. As shown in FIG. 16, the overlying metal layer 1670 can include a plurality of openings 1675 (e.g., holes, slits, etc.) which can alter an associated inductance ($L_{cl\_int}$) corresponding with the overlying metal layer 1670, e.g., as compared to a metal layer without such openings. Of course, other approaches for adjusting (tuning, modifying, achieving, etc.) a clamping inductance of a resonant clamping circuit are possible.

The various apparatus and techniques described herein may be implemented using various semiconductor processing and/or packaging techniques. Some embodiments may be implemented using various types of semiconductor processing techniques associated with semiconductor substrates including, but not limited to, for example, Silicon (Si), Gallium Arsenide (GaAs), Silicon Carbide (SiC), and/or so forth.

It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. As used herein, coupled to, or coupled with can refer to being electrically coupled to, electrically coupled with, physically coupled to, and/or physically coupled with.

Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. A circuit comprising:
a metal-oxide semiconductor field-effect transistor (MOSFET) including a gate, a source, and a drain, the MOSFET having a first breakdown voltage; and
a clamping circuit coupled between the drain and the source, the clamping circuit including:
a diode having a second breakdown voltage that is less than the first breakdown voltage, a cathode of the diode being coupled with the drain of the MOSFET;
an inductor having a first terminal coupled with an anode of the diode, and a second terminal coupled with the source of the MOSFET;
a capacitor; and
a resistor coupled in series with the capacitor.

2. The circuit of claim 1, wherein the clamping circuit is configured to resonate when a voltage applied to the drain of the MOSFET exceeds a breakdown voltage of the diode.

3. The circuit of claim 1, wherein the capacitor and the resistor are coupled in parallel with the diode and the inductor.

4. The circuit of claim 1, wherein the resistor and the capacitor are coupled in parallel with the diode, and coupled in series with the inductor.

5. The circuit of claim 1, wherein the inductor is a first inductor, the clamping circuit further including a resistive-inductive-capacitive (RLC) circuit having:
the capacitor;
the resistor; and
a second inductor, the capacitor, the resistor and the second inductor being coupled in series with each other,
the RLC circuit being coupled in parallel with the diode and the first inductor.

6. The circuit of claim 1, wherein:
the MOSFET is included in a first semiconductor die;
the diode is included in a second semiconductor die that is co-packaged with the first semiconductor die; and
the inductor includes inductance of an electrical interconnect between the first semiconductor die and the second semiconductor die.

7. The circuit of claim 1, wherein:
the circuit is implemented in a semiconductor die;
the diode includes a plurality of interconnected stripes;
the MOSFET includes a plurality of interconnected stripes; and
the inductor includes inductance from at least one of:
an electrical contact to the anode of the diode;
an electrical contact to a source of the MOSFET;
an electrical connection between a first stripe and a second stripe of the plurality of interconnected stripes of the diode;
an electrical connection between a first stripe and a second stripe of the plurality of interconnected stripes of the MOSFET; or
an electrical connection between the anode of the diode and the source of the MOSFET.

8. The circuit of claim 1, wherein:
the circuit is implemented in a semiconductor die; and
the semiconductor die includes a metal layer electrically coupling the source of the MOSFET with the anode of the diode, the metal layer having an inductance included in the inductor.

9. The circuit of claim 8, wherein the metal layer includes a plurality of openings configured to adjust the inductance of the metal layer.

10. A half-bridge circuit comprising:
a high-side transistor circuit including:
a first metal-oxide semiconductor field-effect transistor (MOSFET) including a gate, a source, and a drain, the first MOSFET having a first breakdown voltage; and
a first clamping circuit including:
a first diode having a second breakdown voltage that is less than the first breakdown voltage, a cathode of the first diode being coupled with the drain of the first MOSFET; and
a first inductor having a first terminal coupled with an anode of the first diode, and a second terminal coupled with the source of the first MOSFET; and
a low-side transistor circuit including:
a second MOSFET including a gate, a source, and a drain, the second MOSFET having a third breakdown voltage, the drain of the second MOSFET being coupled with the source of the first MOSFET; and a second clamping circuit including:
a second diode having a fourth breakdown voltage that is less than the third breakdown voltage, a cathode of the second diode being coupled with the drain of the second MOSFET; and
a second inductor having a first terminal coupled with an anode of the second diode, and a second terminal coupled with the source of the second MOSFET;

wherein at least one of the first clamping circuit or the second clamping circuit includes a capacitor and a resistor coupled in series with the capacitor.

11. The half-bridge circuit of claim 10, wherein:
the first clamping circuit is configured to resonate when a voltage applied to the drain of the first MOSFET exceeds a breakdown voltage of the first diode; and
the second clamping circuit is configured to resonate when a voltage applied to the drain of the second MOSFET exceeds a breakdown voltage of the second diode.

12. The half-bridge circuit of claim 10, wherein:
the high-side transistor circuit is implemented in a semiconductor die;
the first diode includes a plurality of interconnected stripes;
the first MOSFET includes a plurality of interconnected stripes; and
the first inductor includes inductance from at least one of:
an electrical contact to the anode of the first diode;
an electrical contact to a source of the first MOSFET;
an electrical connection between a first stripe and a second stripe of the plurality of interconnected stripes of the first diode;
an electrical connection between a first stripe and a second stripe of the plurality of interconnected stripes of the first MOSFET; or
an electrical connection between the anode of the first diode and the source of the first MOSFET.

13. The half-bridge circuit of claim 10, wherein:
the low-side transistor circuit is implemented in a semiconductor die;
the second diode includes a plurality of interconnected stripes;
the second MOSFET includes a plurality of interconnected stripes; and
the second inductor includes inductance from at least one of:
an electrical contact to the anode of the second diode;
an electrical contact to a source of the second MOSFET;
an electrical connection between a first stripe and a second stripe of the plurality of interconnected stripes of the second diode;
an electrical connection between a first stripe and a second stripe of the plurality of interconnected stripes of the second MOSFET; or
an electrical connection between the anode of the second diode and the source of the second MOSFET.

14. A power converter circuit comprising:
an output impedance circuit; and
a half-bridge circuit coupled with the output impedance circuit, the half-bridge circuit including:
a high-side transistor circuit including:
a first metal-oxide semiconductor field-effect transistor (MOSFET) including a gate, a source, and a drain, the first MOSFET having a first breakdown voltage; and
a first clamping circuit including:
a first diode having a second breakdown voltage that is less than the first breakdown voltage, a cathode of the first diode being coupled with the drain of the first MOSFET; and
a first inductor having a first terminal coupled with an anode of the first diode, and a second terminal coupled with the source of the first MOSFET; and
a low-side transistor circuit including:
a second MOSFET including a gate, a source, and a drain, the second MOSFET having a third breakdown voltage, the drain of the second MOSFET being coupled with the source of the first MOSFET; and
a second clamping circuit including:
a second diode having a fourth breakdown voltage that is less than the third breakdown voltage, a cathode of the second diode being coupled with the drain of the second MOSFET; and
a second inductor having a first terminal coupled with an anode of the second diode, and a second terminal coupled with the source of the second MOSFET;

wherein the output impedance circuit includes:
an output inductor having a first terminal coupled to a switching node of the half-bridge circuit, and a second terminal coupled to an output node of the power converter circuit; and
an output capacitor having a first terminal coupled with the output node of the power converter circuit, and a second terminal coupled with the source of the second MOSFET.

15. The power converter circuit of claim 14, wherein:
the power converter circuit is a buck converter circuit.

16. The power converter circuit of claim 14, wherein:
the first clamping circuit is configured to resonate when a voltage applied to the drain of the first MOSFET exceeds a breakdown voltage of the first diode; and
the second clamping circuit is configured to resonate when a voltage applied to the drain of the second MOSFET exceeds a breakdown voltage of the second diode.

17. The power converter circuit of claim 14, wherein:
the first inductor is configured such that a resonance period of the first clamping circuit is less than an avalanche time of the first diode during operation of the power converter circuit; and
the second inductor is configured such that a resonance period of the second clamping circuit is less than an avalanche time of the second diode during operation of the power converter circuit.

18. The power converter circuit of claim 14, wherein:
the first inductor has a first inductance; and
the second inductor has a second inductance that is greater than the first inductance.

19. The power converter circuit of claim 14, wherein at least one of the first clamping circuit or the second clamping circuit includes a capacitor and a resistor coupled in series with the capacitor.

20. The power converter circuit of claim 14, wherein at least one of the first clamping circuit or the second clamping circuit includes a frequency-dependent resistor.

* * * * *